(12) United States Patent
Park et al.

(10) Patent No.: US 7,424,468 B2
(45) Date of Patent: Sep. 9, 2008

(54) INTERNET PROTOCOL ADDRESS LOOK-UP DEVICE

(75) Inventors: Young-Keun Park, Koyang-shi (KR); Kang-Young Moon, Yongin-shi (KR); Byung-Chang Kang, Yongin-shi (KR); Byung-Gu Choe, Seoul (KR)

(73) Assignees: Samsung Electronics Co., Ltd., Suwon-si, Gyeonggi-do (KR); Yonsei University, Sodaemun-gu, Seoul (KR)

( * ) Notice: Subject to any disclaimer, the term of this patent is extended or adjusted under 35 U.S.C. 154(b) by 966 days.

(21) Appl. No.: 10/462,778

(22) Filed: Jun. 17, 2003

(65) Prior Publication Data

US 2004/0024757 A1    Feb. 5, 2004

(30) Foreign Application Priority Data

Jul. 2, 2002    (KR) .................... 10-2002-0037911
Jul. 2, 2002    (KR) .................... 2002-37912

(51) Int. Cl.
*G06F 17/30* (2006.01)
(52) U.S. Cl. .................... 707/3; 707/4; 707/5; 707/6
(58) Field of Classification Search .................... None
See application file for complete search history.

(56) References Cited

U.S. PATENT DOCUMENTS 5,920,886 A    7/1999  Feldmeier
6,052,683 A    4/2000  Irwin
6,061,712 A    5/2000  Tzeng (Continued)

FOREIGN PATENT DOCUMENTS

WO    WO 9819412 A1 *    5/1998

OTHER PUBLICATIONS

Content-addressable memory. (Jul. 16, 2006). In Wikipedia, The Free Encyclopedia. Retrieved 04:26, Aug. 4, 2006, from http://en.wikipedia.org/w/index.php?title=Content-addressable_memory&oldid=64117177.*

(Continued)

*Primary Examiner*—Christian P. Chace
*Assistant Examiner*—Mark Andrew X Radtke
(74) *Attorney, Agent, or Firm*—Robert E. Bushnell, Esq.

(57) ABSTRACT

An IP address look-up device is for looking up an IP address of an IP packet in order to forward the IP packet. The device includes a ternary CAM including pairs of data string and mask string, with the data string having a prefix of an IP address and the mask string representing a length of the prefix, and having routing entries stored in physical segments, respectively, without regard to order of prefix length, the ternary CAM functioning to compare a search key as a destination address of the IP packet to be forwarded, with the routing entries, set a match line of a matching routing entry, and output a mask string of the matching routing entry; and a priority encoder functioning to compare prefix lengths of mask strings outputted in correspondence to set match lines when at least one match line is set in the ternary CAM, determine, as an LPM entry, a routing entry corresponding to a longest mask string, and output a physical address of the LPM entry on the basis of a match line of the LPM entry.

4 Claims, 11 Drawing Sheets

U.S. PATENT DOCUMENTS

| | | | |
|---|---|---|---|
| 6,081,440 | A | 6/2000 | Washburn et al. |
| 6,237,061 | B1 | 5/2001 | Srinivasan et al. |
| 6,252,872 | B1 | 6/2001 | Tzeng |
| 6,288,922 | B1 | 9/2001 | Wong et al. |
| 6,289,414 | B1 * | 9/2001 | Feldmeier et al. ........... 711/108 |
| 6,307,855 | B1 | 10/2001 | Hariguchi |
| 6,370,145 | B1 | 4/2002 | Dally et al. |
| 6,374,326 | B1 | 4/2002 | Kansal et al. |
| 6,401,130 | B1 | 6/2002 | Cain |
| 6,418,042 | B1 | 7/2002 | Srinivasan et al. |
| 6,631,419 | B1 * | 10/2003 | Greene ....................... 709/238 |

OTHER PUBLICATIONS

Kobayashi, et al. A Longest Prefix Match Search Engine for Multi-Gigabit IP Processing. IEEE ICC 2000. Published in 2000. Available online at http://ieeexplore.ieee.org/xpl/abs_free.jsp?arNumber=853719.*

Shah, et al. Fast updating algorithms for TCAM. Micro, IEEE Jan./Feb. 2001. Available online at http://ieeexplore.ieee.org/iel5/40/19527/00903060.pdf?tp=arnumber=903060&isnumber=19527.*

M. Waldvogel, G. Varghese, J. Turner, and B. Plattner. Scalable high-speed prefix matching, 2000. ACM Transactions on Computer Systems. http://citeseer.ist.psu.edu/article/waldvogel01scalable.html.*

Waldvogel, M., Varghese, G., Turner, J., and Plattner, B. 1997. Scalable high speed IP routing lookups. In Proceedings of the ACM SIGCOMM '97 Conference on Applications, Technologies, Architectures, and Protocols For Computer Communication (Cannes, France, Sep. 14-18, 1997). M. Steenstrup, Ed. SIGCOMM '97. ACM Press, New York, NY, 25-36. DOI.*

Request for Comments (RFC) 1517 entitled *Applicability Statement for the Implementation of Classless Inter-Domain Routing (CIDR)* and dated Sep. 1993.

Request for Comments (RFC) 1518 entitled *An Architecture for IP Address Allocation with CIDR*.and dated Sep. 1993.

Request for Comments (RFC) 1519 entitled *Classless Inter-Domain Routing (CIDR): an Address Assignment and Aggregation Strategy* and dated Sep. 1993.

Request for Comments (RFC) 1520 entitled *Exchanging Routing Information Across Provider Boundaries in the CIDR Environment* and dated Sep. 1993.

"*A Longest Prefix Match Search Engine for Multi-gigabit IP Processing*", Kobayashi, M., Murase, T., and Kuriyama, A., in IEEE International Conference on Communications, vol. 3, Jun. 2000, pp. 1360-1364.

U.S. Appl. No. —to be assigned—to Young-Keun Park et al., entitled *Internet Protocol Address Look-Up Method*, which is concurrently filed with this application.

* cited by examiner

INTERNET PROTOCOL ADDRESS LOOK-UP DEVICE

CROSS REFERENCE TO RELATED APPLICATION

This application claims the benefit of co-pending filed Application, entitled INTERNET PROTOCOL ADDRESS LOOK-UP METHOD, and claims all benefits accruing under 35 U.S.C. §119 from an application entitled INTERNET PROTOCOL ADDRESS LOOK-UP DEVICE earlier filed in the Korean Industrial Property Office on 2 Jul. 2002 and there duly assigned Serial No. 2002-37912 and INTERNET PROTOCOL ADDRESS LOOK-UP METHOD, filed in the Korean Industrial Property Office on 2 Jul. 2002 and assigned Serial No. 2002-37911. Each of the above-cited applications is incorporated herein by reference in its entirety.

CLAIM OF PRIORITY

This application makes reference to, incorporates the same herein, and claims all benefits accruing under 35 U.S.C. §119 from an application entitled INTERNET PROTOCOL ADDRESS LOOK-UP DEVICE earlier filed in the Korean Industrial Property Office on 2 Jul. 2002 and there duly assigned Serial No. 2002-37912 and INTERNET PROTOCOL ADDRESS LOOK-UP METHOD, filed in the Korean Industrial Property Office on 2 Jul. 2002 and assigned Serial No. 2002-37911.

BACKGROUND OF THE INVENTION

1. Field of the Invention

The present invention relates to an Internet Protocol (i.e., "IP") addressing technique, and more particularly, to a device for looking up an IP address using a ternary content addressable memory (i.e., "CAM").

2. Description of the Related Art

These days, as Internet users are rapidly increasing and network traffic requiring a broadband, such as multimedia, is growing, the quality of Internet service has deteriorated remarkably. To cope with this problem, various attempts have been made in the art.

In an attempt to improve the routers to provide higher quality Internet service, improving packet throughput has been difficult. Specifically, there have been problems in the case of looking up an Internet protocol (i.e., "IP") address in a router.

Exemplars in the art include publications of RFC (Request for comments) 1517, 1518, 1519 and 1520, a publication entitled *A Longest Prefix Match Search Engine for Multigigabit IP Processing* by Kobayashi, M., Murase, T., and Kuriyama, A., in IEEE International Conference on Communications, vol. 3, June 2000, pp. 1360-1364, U.S. Pat. No. 5,920,886 issued to Feldmeier on 6 Jul. 1999 for Accelerated Hierarchical Address Filtering and Translation Using Binary and Ternary CAMs, U.S. Pat. No. 6,081,440 issued to Washburn et al. on 27 Jun. 2000 for Ternary Content Addressable Memory (CAM) Having Fast Insertion and Deletion of Data Values, U.S. Pat. No. 6,237,061 issued to Srinivasan et al. on 22 May 2001 for Method for Longest Prefix Matching in a Content Addressable Memory, U.S. Pat. No. 6,252,872 issued to Tzeng on 26 Jun. 2001 for Data Packet Filter Using Contents Addressable Memory (CAM) and Method, U.S. Pat. No. 6,288,922 issued to Wong et al. on 11 Sep. 2001 for Structure and Method of an Encoded Ternary Content Addressable Memory (CAM) Cell for Low-power Compare Operation, U.S. Pat. No. 6,370,145 issued to Dally et al. on 9 Apr. 2002 for Internet Switch Router, U.S. Pat. No. 6,418,042 issued to Srinivasan et al. on 9 Jul. 2002 for Ternary Content Addressable Memory with Compare Operand Selected According to Mask Value, U.S. Pat. No. 6,401,130 issued to Cain for Auto Aggregation Method for IP Prefix/Length Pairs, U.S. Pat. No. 6,374,326 issued to Kansal et al. for Multiple Bank Cam Architecture and Method for Performing Concurrent Lookup Operations, U.S. Pat. No. 6,052,683 issued to Irwin for Address Lookup in Packet Data Networks, and U.S. Pat. No. 6,061,712 issued to Tzeng for Method for IP Routing Table Lookup.

I have found that the earlier art have failed to provide an improved apparatus for looking up Internet protocol addresses.

SUMMARY OF THE INVENTION

It is therefore an object of the present invention to provide an IP address look-up device which can look up an IP address without requiring prefixes of a routing table to be arranged in order of length or executing a feedback search.

Another object of the present invention is to provide an IP address look-up device which allows a routing table to be quickly updated and is capable of looking up an IP address using an ordinary ternary CAM.

In accordance with the present invention, the above and other objects can be accomplished by the provision of an IP address look-up device including: a ternary CAM including pairs of data string and mask string, with the data string having a prefix of an IP address and the mask string representing a length of the prefix, and having routing entries stored in physical segments, respectively, without regard to order of prefix length, the ternary CAM functioning to compare a search key as a destination address of the IP packet to be forwarded, with the routing entries, set a match line of a matching routing entry, and output a mask string of the matching routing entry; and a priority encoder functioning to compare prefix lengths of mask strings outputted in correspondence to set match lines when at least one match line is set in the ternary CAM, determine, as a longest prefix matching (i.e., "LPM") entry, a routing entry corresponding to a longest mask string, and output a physical address of the LPM entry on the basis of a match line of the LPM entry.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Three important factors that must be considered upon designing a next-generation router to provide Internet service of high quality include a link speed, a switching speed and a packet throughput. Among these factors, in relation to link speed and switching speed, since it is possible to transmit router input and output at a speed of several to several tens of gigabytes due to development of an optical technology, satisfactory values can be obtained. However, in relation to packet throughput, problems are caused.

Specifically, in the case of looking up an IP (Internet protocol) address in a router, due to a characteristic of an IP address system, a problem is caused in connection with LPM (longest prefix matching). The look-up of an IP address means that, with an aim of forwarding an IP packet, after looking at a destination address included in a header of the IP packet, an entry of a matching address is searched for on a routing table to determine a next-hop. An IP address is expressed by a prefix of unspecified length, and a routing search result of the look-up corresponds to an output link directed toward a final destination of the IP packet, that is, a next metric. The routing search is executed based on an LPM method in which a prefix having a longest length selects a matching entry on the routing table. A problem in connection with the LPM has been caused since an IP (Internet protocol) address assigning scheme, called a CIDR (classless interdomain routing) technique, has been widely adopted as one of the measures capable of solving difficulties induced by depletion of IP address due to a geometrical progression of Internet users, that is, a rapid increase in a size of an Internet routing table throughout the world. The CIDR technique was officially documented in 1993 as RFC (Request for comments) 1517, 1518, 1519 and 1520 to eliminate concepts of networks belonging to the traditional class A, class B and class C in IP addresses. The CIDR technique solves difficulties induced by lack of address space in the class C and squandering of address space in the classes A and B which are caused due to assignment of IP addresses by class in the conventional art, whereby it is possible to efficiently manage the IP address assigning scheme. Nevertheless, entries of the routing table which must be held by the router are increased in their number, as a result of which an IP address look-up speed is slowed.

IP look-up technologies disclosed so far in the art to develop a very high speed router are largely divided into a first category based on hardware using a CAM (content addressable memory), caching and a large-memory structure, and a second category based on software such as an LC (level compressed) trie, hashing and a multibit trie. Realization of the IP address look-up by software provides advantages in that it is more flexible and can be easily applied through correction of a protocol. IP address look-up by hardware is implemented when high-speed packet processing capability that cannot be obtained by the software is required. In this consideration, nowadays, most high-speed routers of main router vendors use hardware to execute IP address look-up.

The CAM used to realize an IP address look-up function through hardware implements a precise match search task in one clock cycle. The CAM compares, in parallel, an inputted search key with all entries within it, that is, all elements stored in segments physically split within it. As a result of the comparison, the CAM outputs an address of a physical segment in which an element matching to the search key is stored. At this time, if there are any data related to the matching element, the data are also outputted. In this way, as the CAM compares, in parallel, the search key with all entries within it and outputs the comparison result, quick search is enabled, and generally, a very short latency time within 10~20 ns (nanoseconds) is required.

Meanwhile, a ternary CAM is regarded as a more flexible type of CAM capable of comparing an inputted search key with stored elements having various lengths. In this ternary CAM, since there is a mask bit string accompanying a content bit string, it is not necessary to compare all content bit strings with the search key. Also, the ternary CAM generally supports a search speed that is several times the rate required for OC-192 (optical carrier level 192, synchronous optical network (SONET) channel capable of carrying approximately 10 gigabits per second) or 10 Gigabit Ethernet, and up to 129K routes can be dealt with in one chip. According to these facts, a ternary CAM can be used to determine LPM (longest prefix matching), and the speed of a ternary CAM is suitable for packet forwarding.

Figure 1:
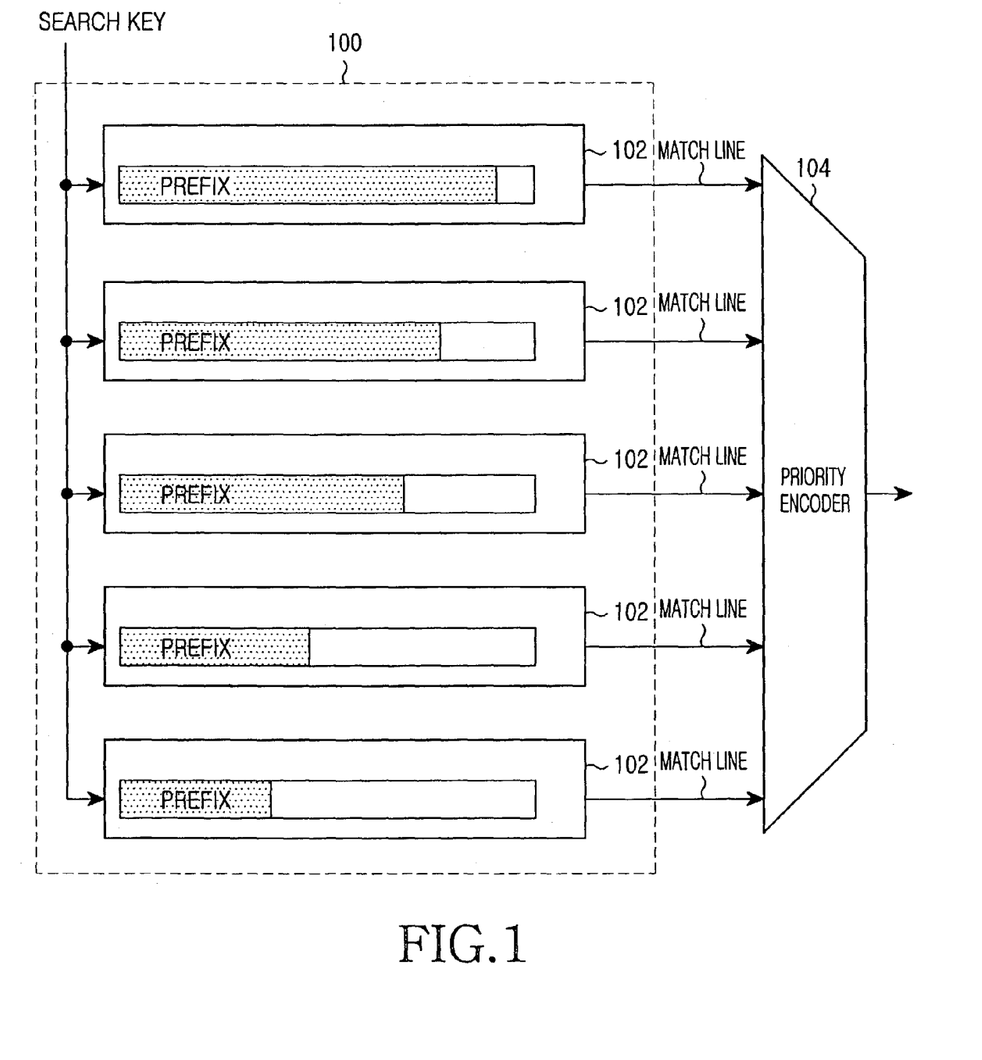
FIG. 1 is a schematic diagram illustrating a conventional IP address look-up device using a ternary CAM.

Referring to FIG. 1, there is shown a schematic diagram illustrating an IP address look-up device using a ternary CAM. As can be readily seen from FIG. 1, in the ternary CAM 100, a plurality of routing entries 102 having respective prefixes are stored in physically split segments, respectively. These routing entries 102 are stored in order of prefix length, starting from a physically low address. Prefixes are compared, in parallel, with a search key as a destination address fetched from a header of an IP packet to undergo a forwarding process. By this comparison, a routing entry having a prefix matching to the search key is searched for. As a result of the search, the ternary CAM 100 sets a match line of the routing entry having the prefix matching to the search key, to "1". Here, "1" means a logic "1", and this applies to the following description. In the same manner, in the following description, "0" means a logic "0". A priority encoder 104 is connected to match lines of the routing entries 102 of the ternary CAM 100. If there exist routing entries matching to the search key, that is, if at least one routing entry corresponding to a set match line exists, the priority encoder 104 searches and outputs a lowermost address among the matching routing entries, that is, a physical address of an LPM entry having a longest prefix length. The physical address of the LPM entry outputted from the priority encoder 104 as described above is applied to a memory (not shown) storing the next metrics. Due to the fact that a next metric stored in the address is outputted from the memory, IP address look-up for one IP packet is completed.

In the IP address look-up pattern as described above and shown in FIG. 1, since the prefixes are stored in order of length, the prefix lowermost among the match lines set by the search result is automatically selected as the LPM. However, the most serious disadvantage of the pattern using the ternary CAM as shown in FIG. 1 is in that the prefixes should be stored in order of length. In this regard, in the case that a new prefix must be added when the routing table is updated, in order to keep the order of length in the ternary CAM 100, all of the prefixes having lengths shorter than the new prefix have to be moved to and stored again in higher addresses. This process of updating the routing table by rearranging the prefixes requires a lengthy period of time when compared to the IP address look-up. Also, because the routing table must be maintained in an off-line state during the rearrangement, the IP address look-up cannot be executed.

A solution to the disadvantage caused by update of the routing table is to preserve unused storage spaces between sets of prefixes having lengths i and i+1. That is to say, the routing entries are divided by length of the prefix, and vacant storage spaces remain in each prefix set to ease addition of new routing entries. Nevertheless, these vacant storage spaces cause a waist of storage space in the ternary CAM. Further, if all vacant storage spaces are filled up, routing entries have to be rearranged, and because the routing table must be maintained in an off-line state during this further rearrangement, the IP address look-up cannot be executed. Recently, as a mobile IP is disclosed in the art, it is expected that, due to frequent routing update in the router, an IP address look-up idle time is increased and IP address look-up performance deteriorates markedly.

Figure 2:
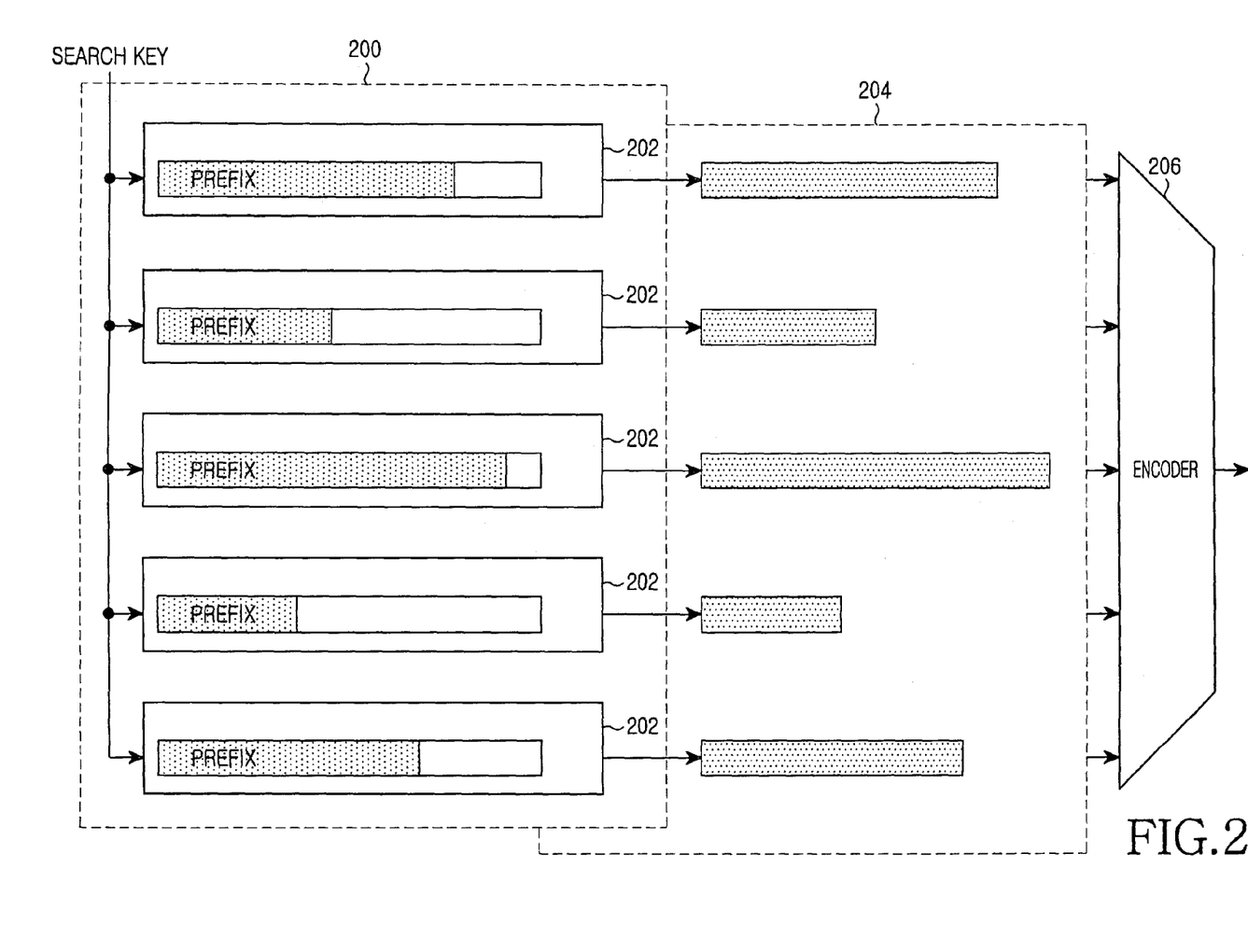
FIG. 2 is a schematic diagram illustrating an IP address look-up device adopting a VLMP method.
Figure 3:
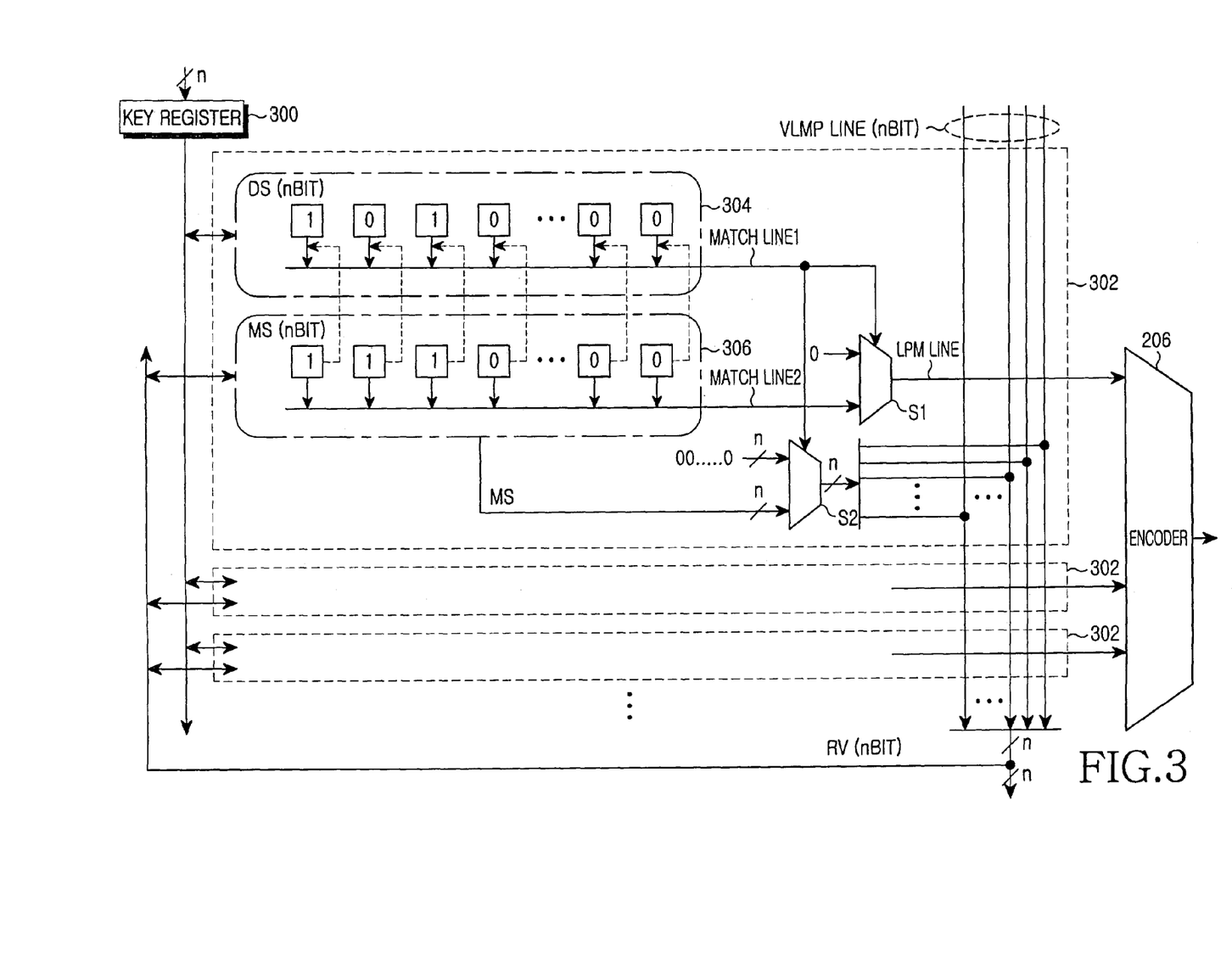
FIG. 3 is a block diagram illustrating the IP address look-up device adopting the VLMP method.

Meanwhile, a VLMP (vertical logical operation with mask encoded prefix length) method suggested by Kobayashi, et al. of NEC Corporation eliminates the limitation that prefixes have to be stored in order of length. The VLMP method was described in the article entitled "A Longest Prefix Match Search Engine for Multi-gigabit IP Processing", Kobayashi, M., Murase, T., and Kuriyama, A., in IEEE International Conference on Communications, vol. 3, June 2000, pp. 1360-1364. Referring to FIG. 2, there is shown a schematic diagram illustrating an IP address look-up device adopting the VLMP method as described in the above article. FIG. 3 is a block diagram illustrating a detailed construction of the device. FIGS. 2 and 3 have certain portions related to FIGS. 1(b) and 5, respectively, of the above article. FIG. 1 has certain portions related to FIG. 1(a) of the article.

IP address look-up adopting the VLMP method will be described with reference to the above article. First, as can be readily seen from FIG. 2, in a ternary CAM 200, while a plurality of routing entries 202 having respective prefixes are stored in physically split segments, respectively, differently from FIG. 1, the routing entries 202 are stored by not following the order of prefix length. The ternary CAM 200 searches for a matching prefix by parallel comparison between a search key and the prefixes of the routing entries 202 and outputs prefix length information of the matching routing entry. If there exists at least one matching routing entry, in the same manner as described above, an LPM must be chosen among matching routing entries. To this end, as in FIG. 3 which will be described later, in a VLMP circuit 204 where, after logically operated, an output of the ternary CAM 200 is fed back to the ternary CAM 200 to execute a secondary search, among the matching routing entries searched for in the ternary CAM 200, an LPM entry satisfying the LPM is determined using length information of the matching prefixes. A physical address of the LPM entry determined in this way is outputted by the encoder 206.

Referring now to FIG. 3, a plurality of routing entries 302 are connected to an output of a key register 300 which temporarily stores a search key, and the encoder 206 is connected to outputs of the routing entries 302. Each routing entry 302 has a pair of bit strings of the same length, that is, a data string (i.e., "DS") of n bits and a mask string (i.e., "MS"). The data string DS includes, starting from an MSB (most significant bit), prefixes of IP addresses matching to the respective routing entries, and remaining bits mean data bit strings which are filled with "0". The mask string MS serves as a mask bit string representing a prefix length of an IP address. Respective mask bits are filled, starting from the MSB, with continuous bit strings of "1" which are the same as prefix lengths, and remaining bits are filled with "0". For example, to represent a prefix "110", a data string becomes "11000000" and a mask string becomes "11100000".

In FIG. 3, the LPM search for the search key stored in the key register 300 is executed through two stages as described below.

First Stage 1-1. A search key K stored in the key register 300 is connected to the entries 302.

1-2. In each entry block 304, mask comparison, R1:=(K & MS) XNOR (DS & MS), is conducted. Here, "&" means a bitwise AND operation, and "XNOR" means a bitwise exclusive NOR operation.

1-3. All bits of R1 are AND-operated in each entry block 304, and the result is provided as a match line 1.

1-4. If the match line 1 is set to "1", a selector S2 outputs a mask string MS to a VLMP line. Otherwise, the selector S2 outputs "00 . . . 0" having the same length as the mask string MS, to the VLMP line.

1-5. A vertical bitwise OR operation, that is, the VLMP is implemented at each bit position of the VLMP line. The result is represented as RV in FIG. 3.

Second Stage 2-1. An RV is connected to entries 302.

2-2. The two bit strings, that is, the RV and the mask bit string MS are precisely compared with each other in each entry block 306. In other words, R2:=RV NOR MS is conducted.

2-3. All bits of R2 are AND-operated in each entry block 306, and the result is provided to a match line 2.

2-4. If both of a match line 1 and a match line 2 of a certain entry are "1", a selector S1 outputs "1" to the LPM line. Otherwise, the selector S1 outputs "0" to the LPM line.

Only the LPM line of a routing entry determined as an LPM entry among the routing entries 302 through the above-described two stages is set to "1". According to this, the encoder 206 which is connected to LPM lines of the routing entries searches for and outputs a physical address of a routing entry matching to an LPM line that is set to "1".

For example, assuming that a search key is inputted as "11011111" in a state where four prefixes, P1="110", P2="1001", P3="11011" and P4="1101", are sequentially stored in first through fourth routing entries, respectively, among the routing entries 302, as the search key is compared in parallel with the prefixes, the first, third and fourth routing entries match. Then, VLMP is implemented for mask strings corresponding to the first, third and fourth routing entries. In the above example, mask strings, P1_mask="11100000", P3_mask="11111000" and P4_mask="11110000", and the VLMP result is "11111000". This VLMP result is the same irrespective of storing sequence of mask strings. Therefore, it is not necessary for the prefixes to be arranged in order of length. Once the VLMP result is obtained, it is to be readily understood that the LPM occurred for an entry including a mask string that perfectly matches to the VLMP result. Thereafter, by secondarily comparing the VLMP result, "11111000", with the P1_mask, P3_mask and P4_mask, as the third entry matches to the VLMP result, it is to be understood that the third entry becomes the LPM entry.

According to the IP address look-up adopting the VLMP method as described above, it is possible to find an LPM entry although prefixes are not arranged in order of length. Thus, when a routing table is updated, since it is not necessary to rearrange the prefixes even in the case that a new prefix must be added, update can be quickly implemented. Nonetheless, because the VLMP is added and the VLMP result should be fed back as a search key, additional circuits are required. Hence, the IP address look-up device adopting the VLMP method is manufactured as a dedicated LSI (large scale integration) including the additional circuits.

As a result, the conventional IP address look-up methods disclosed so far in the art suffer from defects in that the prefixes of the routing table must be arranged in order of length, or, even when it is not necessary to arrange the prefixes in order of length, circuits for feedback search must be added to the ternary CAM.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Figure 4:
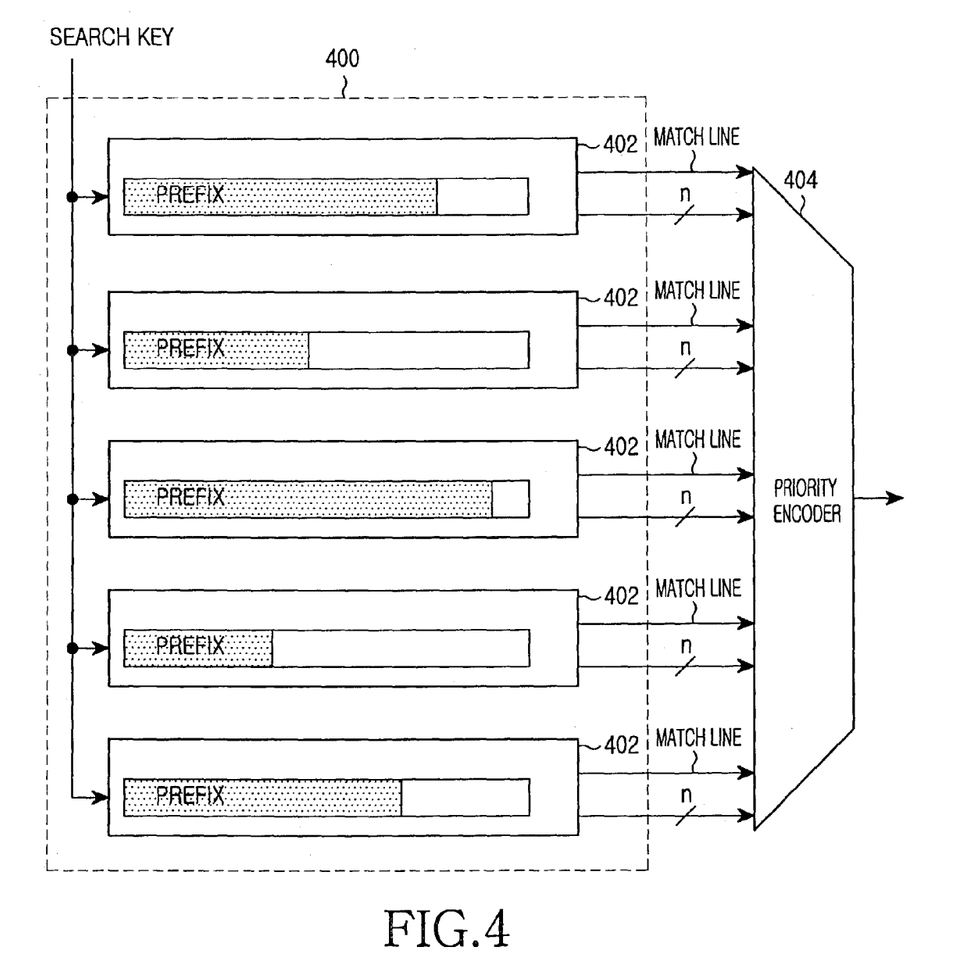
FIG. 4 is a schematic diagram illustrating an IP address look-up device using a ternary CAM in accordance with an embodiment of the present invention.

FIG. 4 is a schematic diagram illustrating an IP address look-up device using a ternary CAM in accordance with an embodiment of the present invention. The IP address look-up device according to the present invention includes a ternary CAM 400, and a priority encoder 404 connected to an output of the ternary CAM 400. As can be readily seen from FIG. 4, in the ternary CAM 400, routing entries 402 having respective prefixes are stored in physical segments, respectively, without regard to order of prefix length. The ternary CAM 400 functions to compare, in parallel, a search key with the prefixes of the routing entries to search a matching prefix, set a match line of a matching routing entry, and output a mask string of the matching routing entry to the priority encoder 404. Then, in the case that at least one match line is set in the ternary CAM 400, that is, in the case that at least one among match lines of the routing entries 402 is set, the priority encoder 404 compares prefix lengths of mask strings outputted in correspondence to set match lines, determines, as an LPM entry, a routing entry corresponding to a longest mask string, and outputs a physical address of the LPM entry on the basis of a match line of the LPM entry.

Figure 5:
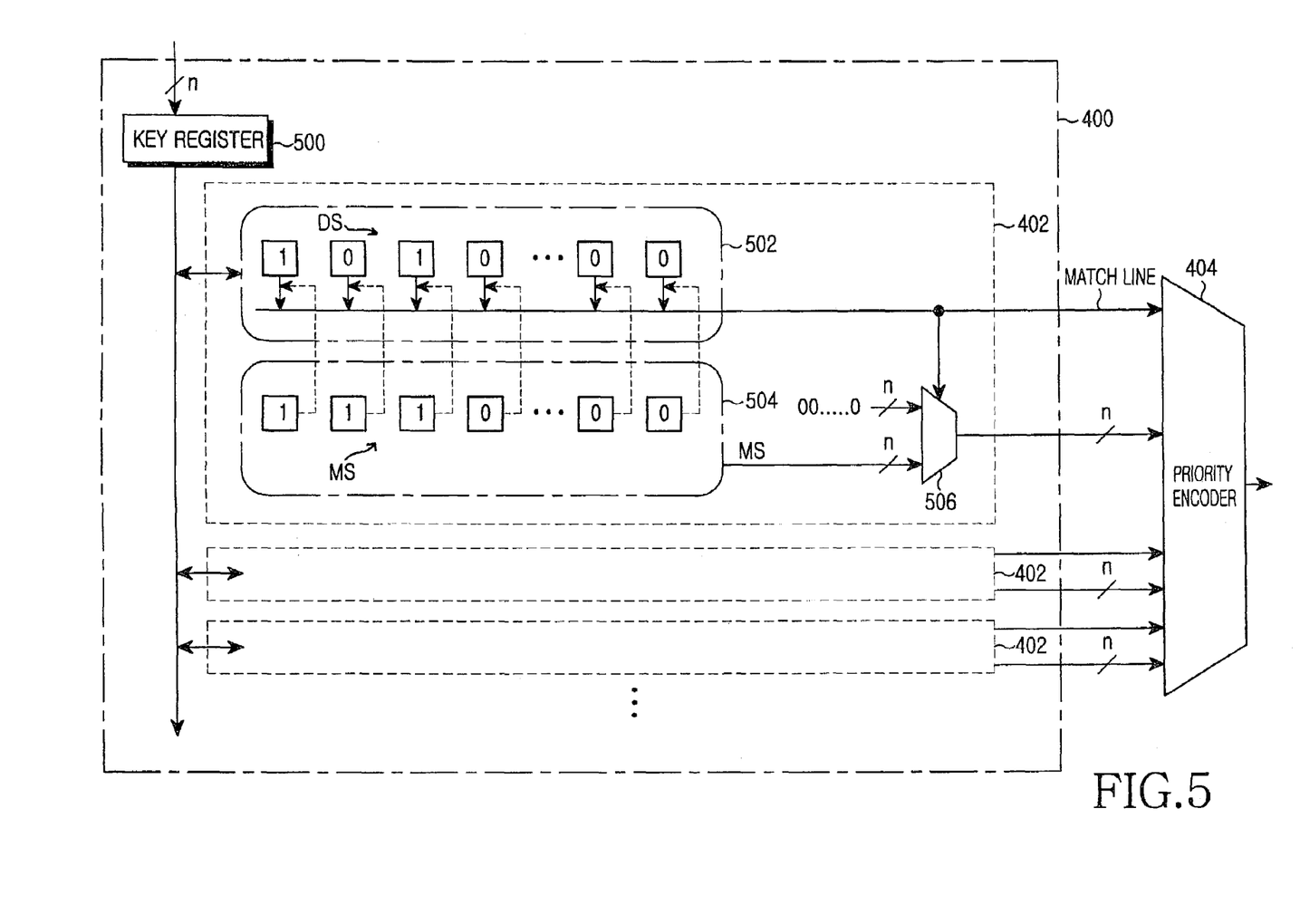
FIG. 5 is a block diagram illustrating the IP address look-up device using the ternary CAM according to the present invention.

Referring to FIG. 5 which is a block diagram illustrating the IP address look-up device according to the present invention, in the ternary CAM 400, the plurality of routing entries 402 are connected to an output of a key register 500 for temporarily storing a search key, and the priority. encoder 404 is connected to outputs of the routing entries 402 of the ternary CAM 400. In the same manner as the routing entry 302 aforementioned with reference to FIG. 3, each routing entry 402 has a pair of bit strings of the same length, that is, a data string DS of n bits and a mask string MS. The search key of the key register 500 is connected to the routing entries 402, and, in the same manner as the block 304 of FIG. 3, in a block 502 of each entry, R1:=(K & MS) XNOR (DS & MS) is conducted. Then, all bits of R1 are AND-operated in each entry block 502, and the result is provided as a match line. A selector 506 functions to select, depending upon whether or not a match line is set in each entry, a mask string MS (from entry block 504) or "00 . . . 0" continued with the same length as the mask string MS, and output the selected mask string MS or "00 . . . 0" to the priority encoder 404. If the match line is set to "1", the selector 506 outputs the mask string MS. Otherwise, the selector 506 outputs "00 . . . 0".

As described above, if at least one match line is set in the ternary CAM 400, the priority encoder 404 compares prefix lengths of mask strings outputted from the ternary CAM 400 in correspondence to set match lines, and determines, as an LPM entry, a routing entry corresponding to a longest mask string. Thereupon, in the same manner as in FIG. 1, the priority encoder 404 outputs a physical address of the LPM entry determined in this way, on the basis of a match line of the LPM entry. At this point, the priority encoder 404 compares and searches for the prefix lengths of the mask strings to determine an LPM entry, starting from an MSB (most significant bit). The reason why the MSB is first compared is that, as described above, the mask strings are filled, starting from the MSB, with continuous bit strings of "1" having the same length as the prefix, and remaining strings are filled with "0".

Figure 6:
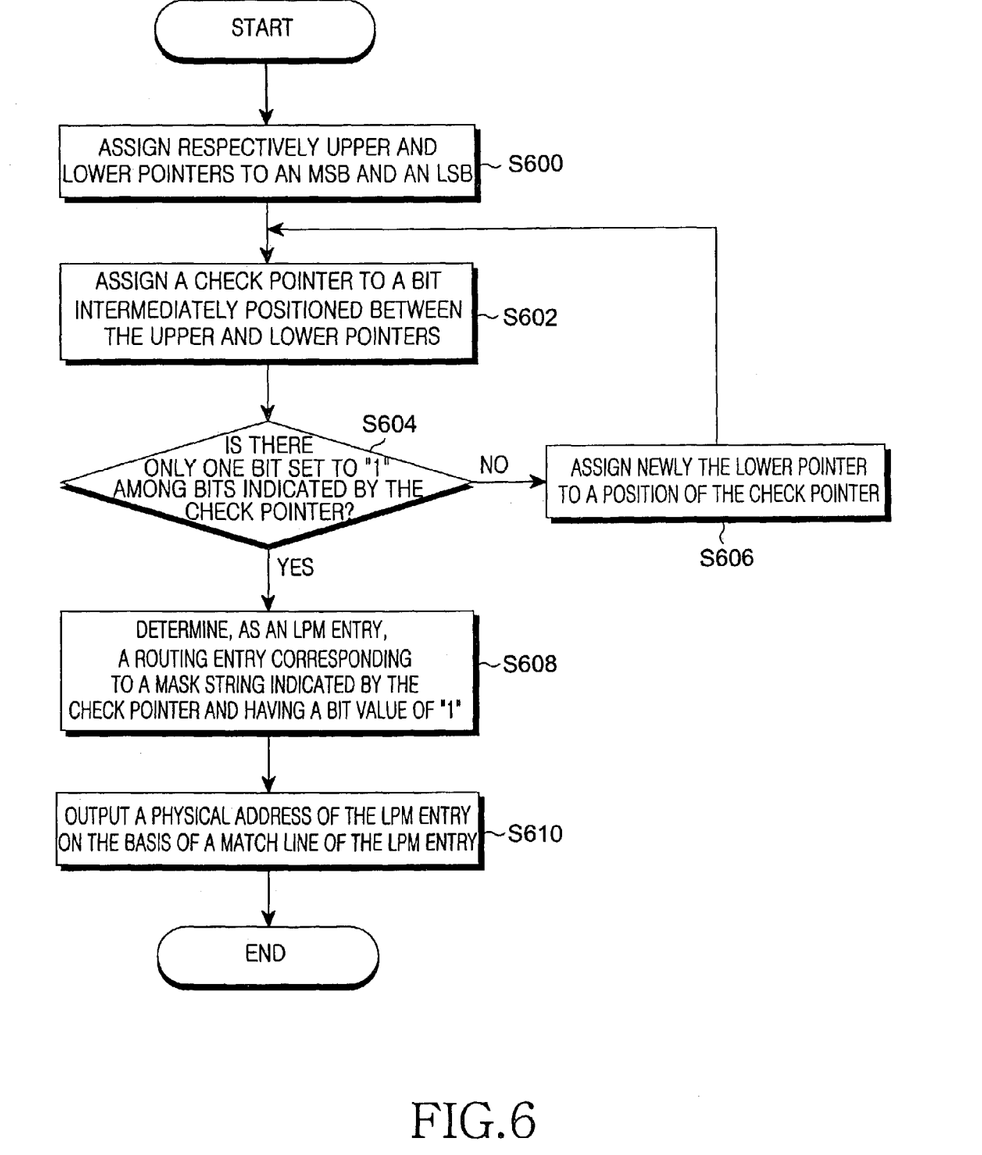
FIG. 6 is a flowchart illustrating operations of a priority encoder according to the present invention.
Figure 7A:
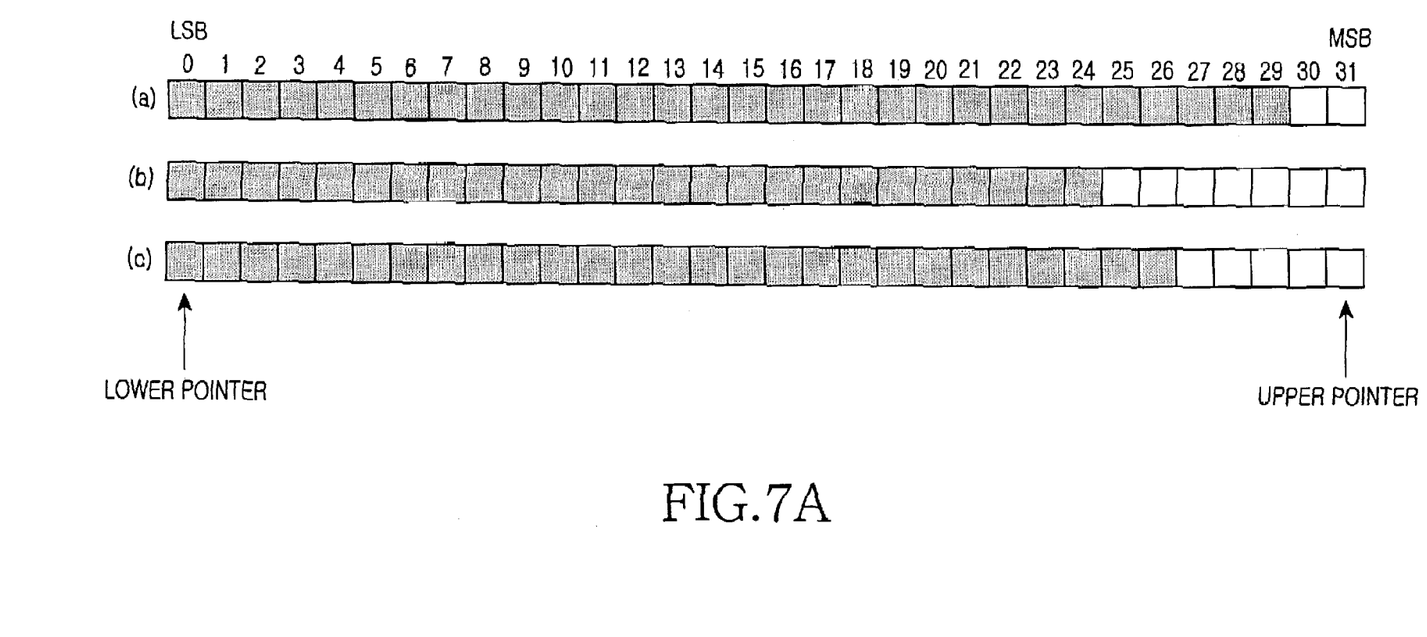
FIGS. 7A through 7D are views illustrating LPM searching operations of the priority encoder according to the present invention.
Figure 7B:
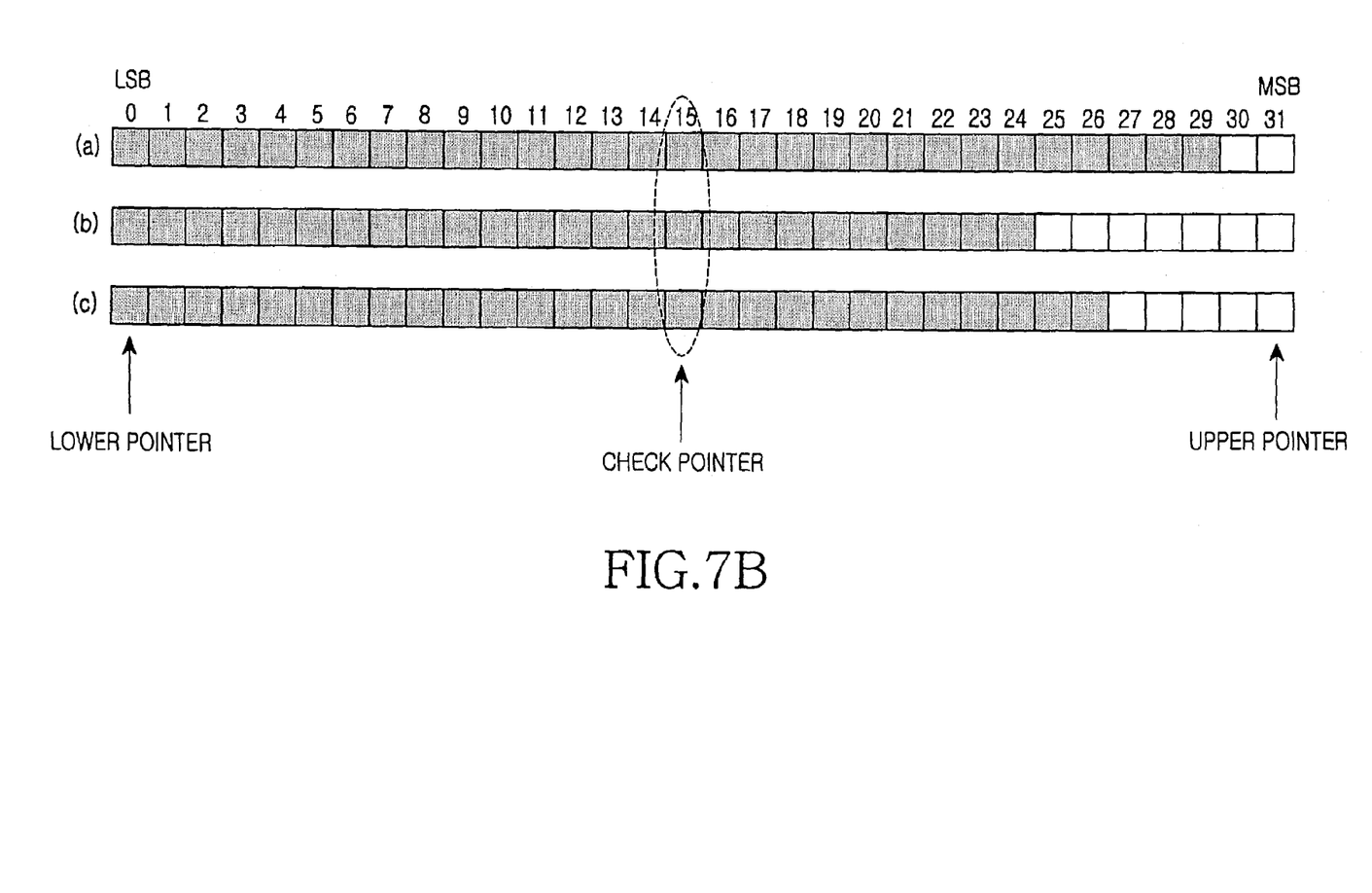
Figure 7C:
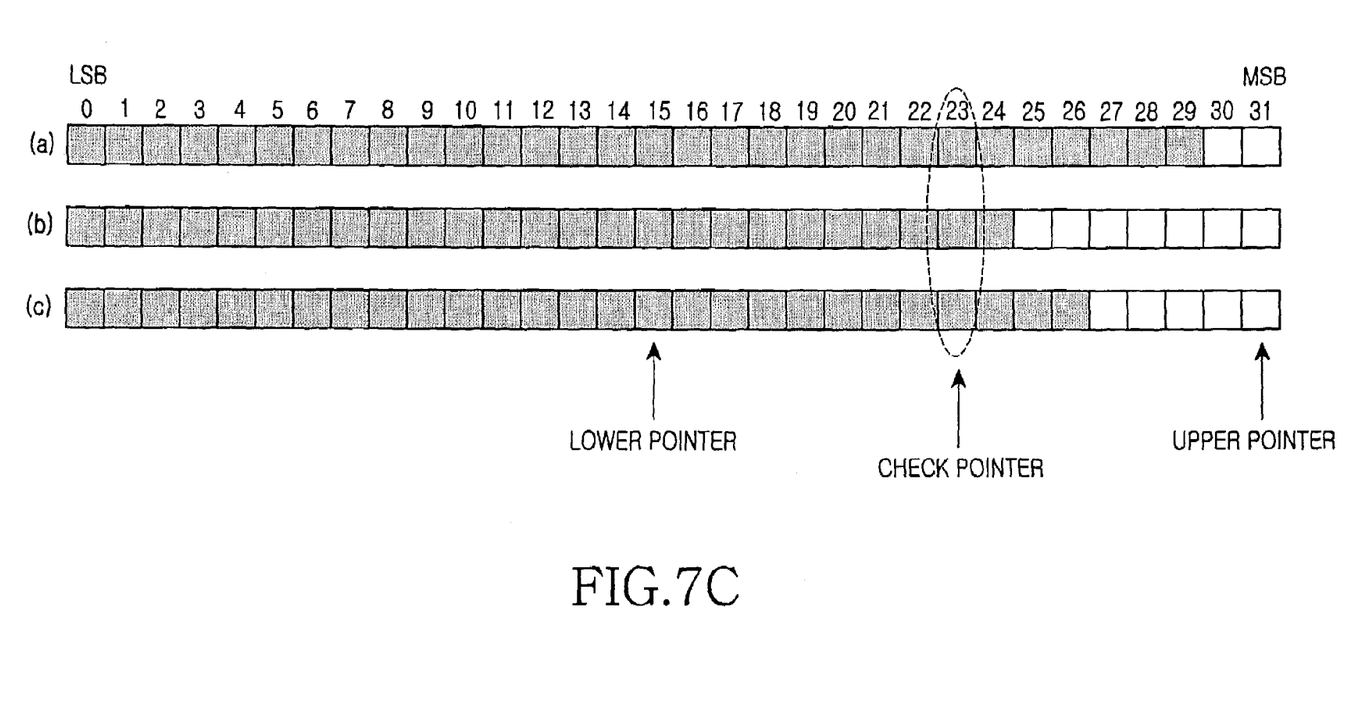
Figure 7D:
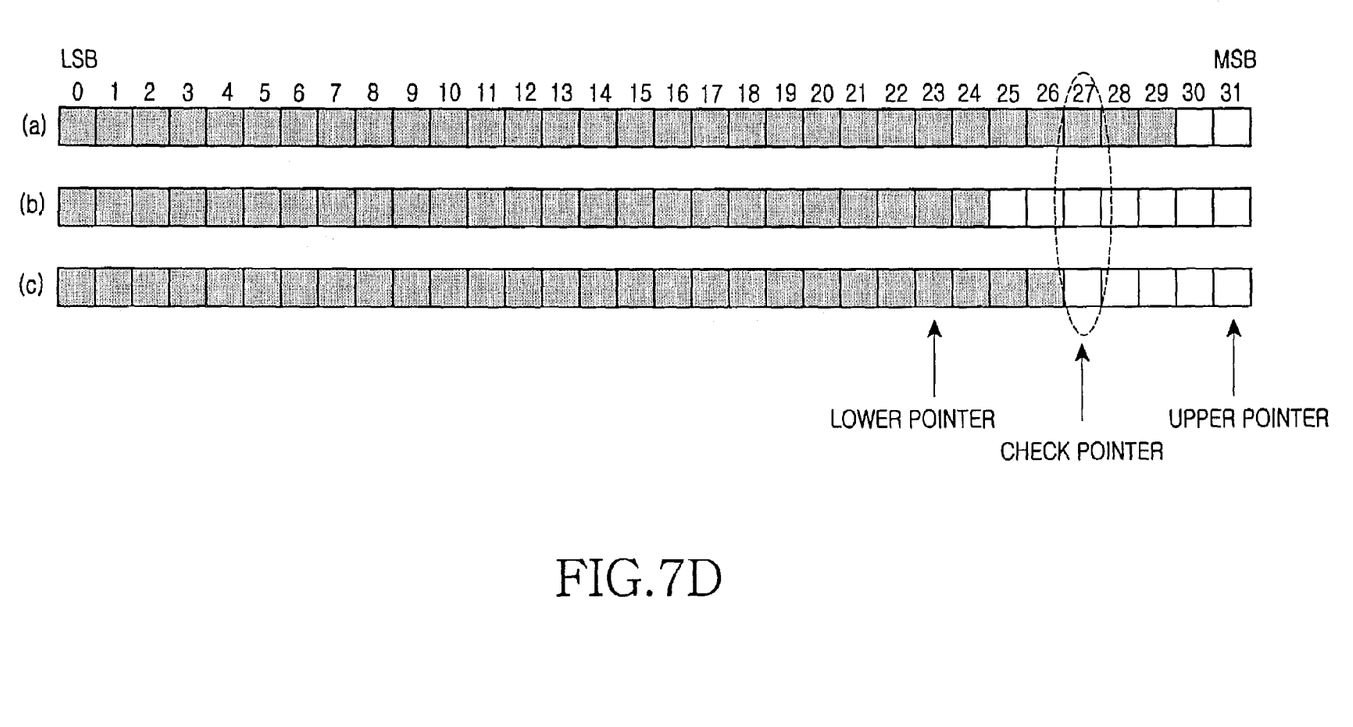

A procedure in which the priority encoder 404 compares lengths of the mask strings, determines the LPM entry and outputs the physical address of the LPM entry is shown by steps S600 through S610 in FIG. 6. Referring to FIGS. 7A through 7D, LPM searching operations of the priority encoder 404 are illustrated supposing that there are three mask strings, for the purpose of comparison. If at least one match line is set in the ternary CAM 400, at step S600, the priority encoder 404 respectively assigns upper and lower pointers to the MSB and an LSB (least significant bit) as shown in FIG. 7A, among mask strings outputted in correspondence to set match lines. Then, at step S602, the priority encoder 404 assigns a check pointer to an intermediate position between the upper and lower pointers, as shown in FIG. 7B. Thereupon, at step S604, it is confirmed whether or not there is only one bit set to "1", suggesting that, among the mask strings, a bit value indicated by the check pointer is a bit representing a prefix. If there exist two or more bits set to "1", at step S606, the lower pointer is newly assigned to a position of the check pointer, as shown in FIG. 7C, and the program returns to step S602. After passing through steps S602 and S604, if there still exist two or more bits set to "1", at step S606, the lower pointer is further newly assigned to a position of the check pointer, as shown in FIG. 7D, and the program returns to step S602. After doing this, if there exists one bit set to "1" as shown in FIG. 7D, at step S608, a routing entry corresponding to a mask string indicated by the check pointer at that time and having a bit value of "1" is determined as an LPM entry. Thereafter, at step S610, a physical address of the LPM entry determined in this way is outputted on the basis of a match line of the LPM entry, in the same manner as in FIG. 1.

Accordingly, in the present invention, while, as in the aforementioned VLMP method, the prefixes are stored in the ternary CAM 400 without regard to order of length, it is not necessary to conduct feedback searches. Therefore, not only a routing table can be quickly updated, but also it is possible to look up an IP address using an ordinary ternary CAM rather than a dedicated LSI, only by changing a priority encoder.

Figure 8:
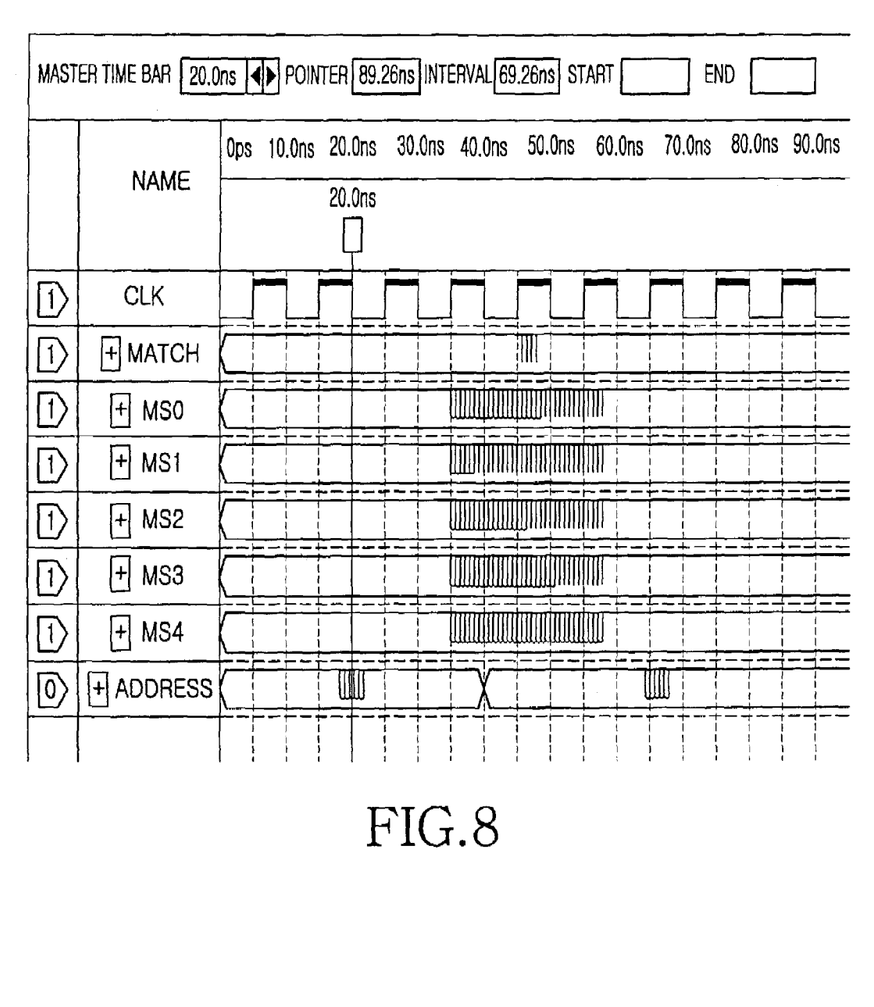
FIG. 8 is a view illustrating a simulation result of the IP address look-up device using the ternary CAM according to the present invention.

For reference, by framing the priority encoder 404 as described above using VHDL (very high speed hardware description language) codes and performing simulation, as can be readily seen from FIG. 8, it was found that it takes about 40 ns (nanoseconds) to implement the look-up process for one IP packet. It is to be understood from FIG. 8 that, when a prefix length is 27 bits, among five mask strings MS0 through MS4, the second mask string MS1 is determined to correspond to an LPM entry, and a physical address ADDRESS of a second routing entry is outputted as "00010". In addition to the 40 ns, considering 10 ns elapsed while the ternary CAM 400 conducts the parallel search until the result is obtained, total 50 ns are required. Thus, searches can be conducted about twenty-five million times a second. By this fact, the present invention can be applied to an IP backbone router which has input and output of a 10 Gbps (gigabits per second) level and requires router table update by about 1000 times a second, and can support a forwarding speed of 9.6 Gbps satisfying OC-192 per port capable of being used in a terabit router which is currently being developed with an aim of obtaining the highest speed.

Although the preferred embodiments of the present invention have been disclosed for illustrative purposes, those skilled in the art will appreciate that various modifications, additions and substitutions are possible, without departing from the scope and spirit of the invention. In particular, while it was illustratively explained in the embodiment of the present invention that a lower pointer is newly assigned to a position of a check pointer and lengths of mask strings are compared to search an LPM entry, a person skilled in the art will readily recognize that the lengths of the mask strings can be compared in different ways to search the LPM entry. Therefore, the scope and spirit of the invention must be defined only by the accompanying claims and their equivalents.

What is claimed is:

1. An Internet protocol address look-up device for looking up an Internet protocol address of an Internet protocol packet in order to forward the Internet protocol packet, the device comprising:

a ternary content addressable memory including pairs of data string and mask string, with the data string including a prefix of an Internet protocol address and the mask string representing a length of the prefix, and including routing entries stored in physical segments, respectively, without regard to order of prefix length, the ternary content addressable memory functioning to compare a search key as a destination address of the Internet protocol packet to be forwarded, with the routing entries, set a match line of a matching routing entry, and output a mask string of the matching routing entry; and a priority encoder functioning to compare prefix lengths of mask strings outputted in correspondence to set match lines when at least one match line is set in the ternary content addressable memory, determine, as a longest prefix matching entry, a routing entry corresponding to a longest mask string, and output a physical address of the longest prefix matching entry on the basis of a match line of the longest prefix matching entry.

2. The Internet protocol address look-up device of claim 1, the priority encoder searching the prefix lengths of the mask strings, starting from a most significant bit.

3. The Internet protocol address look-up device of claim 2, said ternary content addressable memory further comprising a selector functioning to select a mask string and output selected mask string according to whether a match line is set.

4. Internet protocol address look-up device of claim 1, wherein no circuits for feedback search being connected to said content addressable memory and said priority encoder.

* * * * *